United States Patent
Thiery et al.

(10) Patent No.: US 7,772,919 B2
(45) Date of Patent: Aug. 10, 2010

(54) DOUBLE STAGE COMPACT CHARGE PUMP CIRCUIT

(75) Inventors: Vincent Thiery, La Roque d'Antheron (FR); Kevin Thevenet, La Roque d'Antheron (FR)

(73) Assignee: International Rectifier Corporation, El Segundo, CA (US)

( * ) Notice: Subject to any disclaimer, the term of this patent is extended or adjusted under 35 U.S.C. 154(b) by 193 days.

(21) Appl. No.: 12/179,193

(22) Filed: Jul. 24, 2008

(65) Prior Publication Data
US 2009/0045868 A1 Feb. 19, 2009

Related U.S. Application Data (60) Provisional application No. 60/952,092, filed on Jul. 26, 2007.

(51) Int. Cl.
*G05F 1/10* (2006.01)
*G05F 3/02* (2006.01)
(52) U.S. Cl. ...................................... 327/536
(58) Field of Classification Search .................. 327/536; 363/59–60
See application file for complete search history.

(56) References Cited

U.S. PATENT DOCUMENTS

| 2003/0128560 A1* | 7/2003 | Saiki et al. | 363/65 |
| 2005/0195019 A1* | 9/2005 | Okamoto | 327/536 |
| 2007/0063761 A1* | 3/2007 | Chou et al. | 327/536 |
| 2008/0094129 A1* | 4/2008 | Tahata | 327/536 |

* cited by examiner

*Primary Examiner*—Quan Tra
(74) *Attorney, Agent, or Firm*—Farjami & Farjami LLP (57) ABSTRACT

A charge pump circuit comprising a plurality of charge pumps connected in parallel, each charge pump receiving a plurality of clock signals, having an output (VCP) that is coupled to the output of the at least one other charge pump, and further comprising a first capacitor that is being charged by a switching circuit receiving the clock signals to charge the first capacitor, a second capacitor coupled in series with the first capacitor, the second capacitor provided between a first terminal (IN) of the charge pump and a second terminal (OUT) of the charge pump, wherein the first terminal (IN) of the charge pump is connected to a second terminal (OUT) of another charge pump and the second terminal (OUT) of the charge pump is connected to the first terminal (IN) of another charge pump.

12 Claims, 7 Drawing Sheets

DOUBLE STAGE COMPACT CHARGE PUMP CIRCUIT

CROSS-REFERENCE TO RELATED APPLICATIONS

The present application claims the benefit and priority of U.S. Provisional Application 60/952,092 filed Jul. 26, 2007 entitled DOUBLE STAGE COMPACT CHARGE PUMP, the entire disclosure of which is hereby incorporated by reference.

BACKGROUND OF THE INVENTION

The present invention relates to charge pumps for producing voltages above a power supply voltage present in a circuit. In particular, the present invention provides a charge pump for creating a relatively large voltage (approximately 6-10 volts) above the Vdd voltage with respect to a supply rail Vss which is a preset voltage below Vdd, for example, 4 to 6 volts below Vdd. Such charge pump voltage supplies are needed to supply the high side power supplies for high side drivers of power switching circuits.

Figure 1:
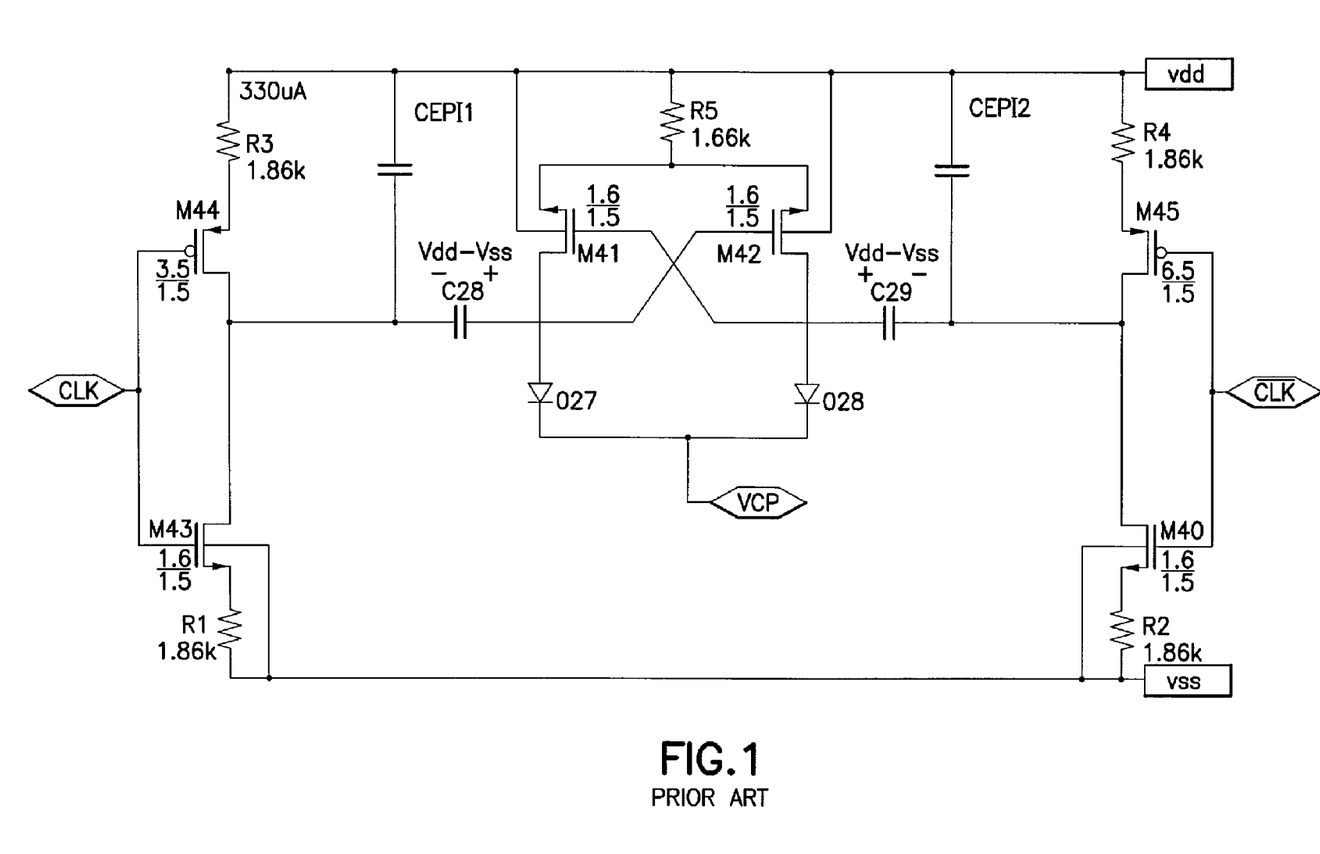
FIG. 1 shows the prior art charge pump circuit.

FIG. 1 shows a prior art charge pump that operates off a two phase clock. The clock signal comprises a signal clock CLK and the inverted-clock signal which is 180° out of phase with CLK.

This circuit operates as follows. When the clock CLK is high, C28 charges via M43 and M41 between Vdd and Vss as shown. The capacitor C28 charges to a voltage Vdd−Vss, as shown.

When the clock CLK goes low, M44 pulls the DP+ side of C28 to Vdd, current flows out of C28 polyside via floating polydiode D27 to VCP, the charge pump output. At that time, the voltage on C28 is above Vdd and turns on M42 gate thus allowing C29 to charge as shown between Vdd and Vss through M42 and M40, which is turned on by the inverted clock signal. When the inverted clock goes low, M45 is turned on, allowing C29 to discharge to VCP through diode D28. The charge pump voltage is provided through the diodes D27 and D28 to VCP. The cycle then repeats. The maximum VCP voltage is Vdd−Vss less the drop in either the diode D27 or D28, so approximately 5.4 volts given a 0.6 volt drop in the diode. A typical voltage at VCP will be approximately 5.2 volts.

Shoot through discharge of C28 via M41 is removed by the cross configuration connecting the gate of M41 to the opposite side, i.e., the C29 side which uses the inverted clock as an input. The same is true for the C29 side, with its cross connection of the gate of M42 to the C28 side. The DPplus epi capacitors Cepi1 and Cepi2 are parasitic capacitors that reduce efficiency.

The described charge pump only allows a voltage of slightly over 5 volts to be produced above the Vdd voltage if Vdd=6v. It is desirable to be able to produce a larger voltage, for example, approximately at least 6v above Vdd, and possibly as much as almost 10v, above Vdd. The described prior art circuit cannot provide such a voltage.

SUMMARY OF THE INVENTION

It is accordingly an object of the present invention to provide a charge pump which can provide larger voltages than the prior art charge pump above the power supply Vdd voltage.

According to the invention, a charge pump circuit is provided comprising a plurality of charge pumps each having their outputs connected in parallel, each charge pump receiving a plurality of clock signals, a clock signal oscillator for producing the plurality of clock signals, the clock signals being out of phase, each charge pump having an output that is coupled to the output of the at least one other charge pump, further comprising a first capacitor in each charge pump, the first capacitor being charged by a switching circuit receiving said clock signals to charge the first capacitor to a voltage between a supply voltage and a reference potential, and further comprising a second capacitor coupled in series with the first capacitor, the second capacitor provided between a first terminal (IN) of the charge pump and a second terminal (OUT) of the charge pump, wherein the first terminal (IN) of the charge pump is connected to a second terminal (OUT) of another charge pump and the second terminal (OUT) of the charge pump is connected to a first terminal (IN) of another charge pump, and wherein when the first capacitor is charged by the switching circuit, the second capacitor is charged by its connection to another charge pump, the switching circuit connecting a first terminal of the first capacitor to the supply voltage thereby elevating a second terminal of the first capacitor to an elevated voltage, the second terminal of the first capacitor being connected to a first terminal of the second capacitor, and thereby elevating a second terminal of the second capacitor to a further elevated voltage elevated above the elevated voltage on the first capacitor, the further elevated voltage on the second terminal of the second capacitor being provided to the charge pump output.

Other features and advantages of the present invention will become apparent from the following description of the invention which refers to the accompanying drawings.

BRIEF DESCRIPTION OF THE DRAWING(S)

The invention will now be described in greater detail in the following detailed description with reference to the drawings in which.

DETAILED DESCRIPTION OF PREFERRED EMBODIMENTS OF THE INVENTION

Figure 2:
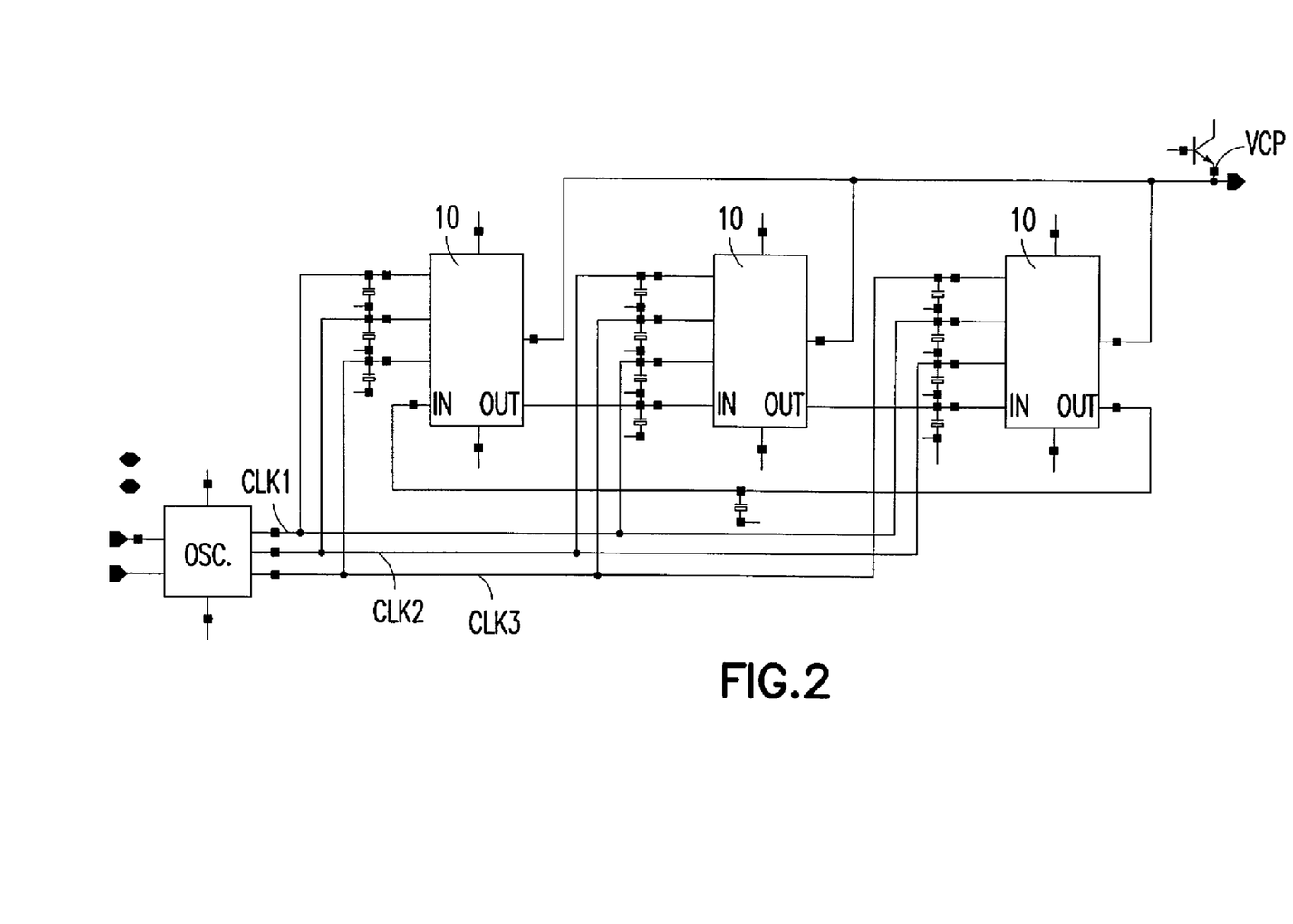
FIG. 2 shows the charge pump circuit according to the present invention that includes three two-stage charge pumps.
Figure 3:
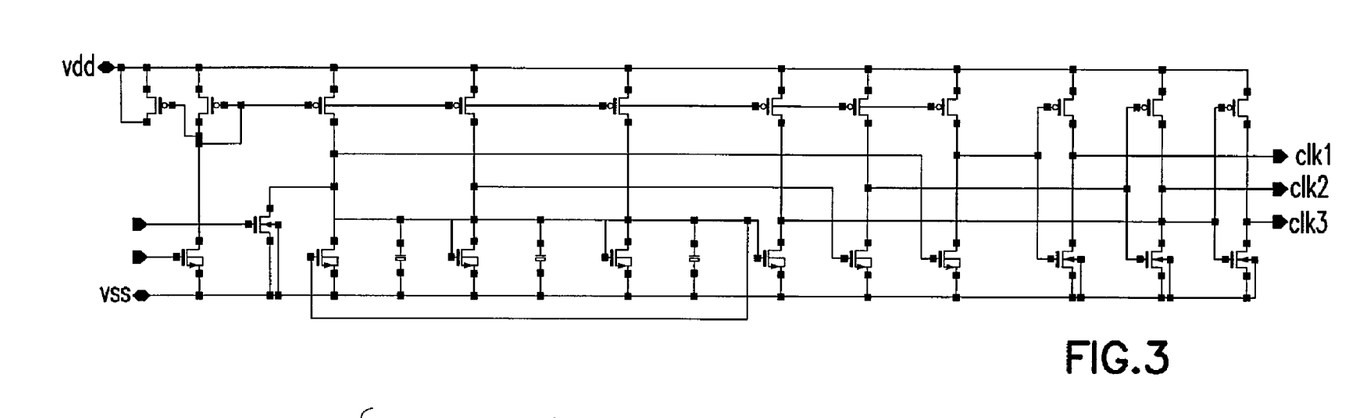
FIG. 3 shows the oscillator of the charge pump circuit of FIG. 2.

Turning to FIG. 2, the present invention comprises a charge pump circuit comprising a plurality of double stage compact charge pumps 10. The double stage compact charge pump 10 is a component of a three component charge pump circuit shown in FIG. 2. Each of the components 10 is identical. Each component 10, three of which are shown in FIG. 2, is shown in detail in FIG. 4. Each charge pump receives three clock signals from the oscillator of FIG. 3. The oscillator of FIG. 3 is, for example, a ring oscillator that produces three 50% duty cycle 120° out of phase signals, clock 1, clock 2 and clock 3. The clock 1, clock 2 and clock 3 signals are fed to each charge pump 10. However, the main clock signal CLK for each charge pump 10 is 120° out of phase with the main clock signal of another charge pump. The three charge pumps of FIG. 2 have their outputs VCP coupled together to the common point VCP. Thus, the charge pump outputs are in parallel. Further, a terminal input (IN) of each charge pump is coupled to a terminal (OUT) of another charge pump. Thus, the terminal (IN) of the first charge pump in FIG. 2 is coupled to the terminal (OUT) of the last charge pump in FIG. 2. The terminal (IN) input of the second charge pump is coupled to the terminal (OUT) of the first charge pump and the terminal (IN) of the third charge pump is coupled to the terminal (OUT) of the second charge pump.

Figure 3A:
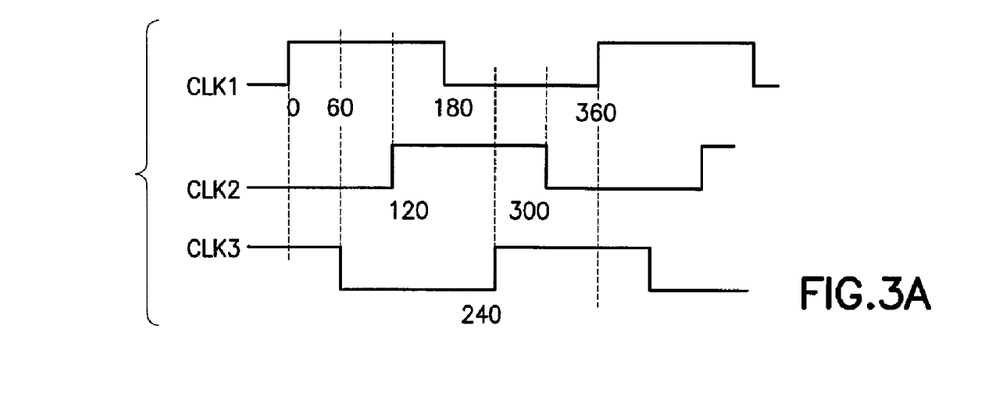
FIG. 3A shows the three clock signals.

FIG. 3 shows the details of the oscillator of FIG. 2. It is a ring oscillator that produces three 120° out of phase 50% duty cycle clock signals, as shown in FIG. 3A. The oscillator includes a NMOS inverter stage followed by a CMOS inverter stage to clean up the clock signals. Any oscillator that produces such clock signals can be employed.

Figure 4:
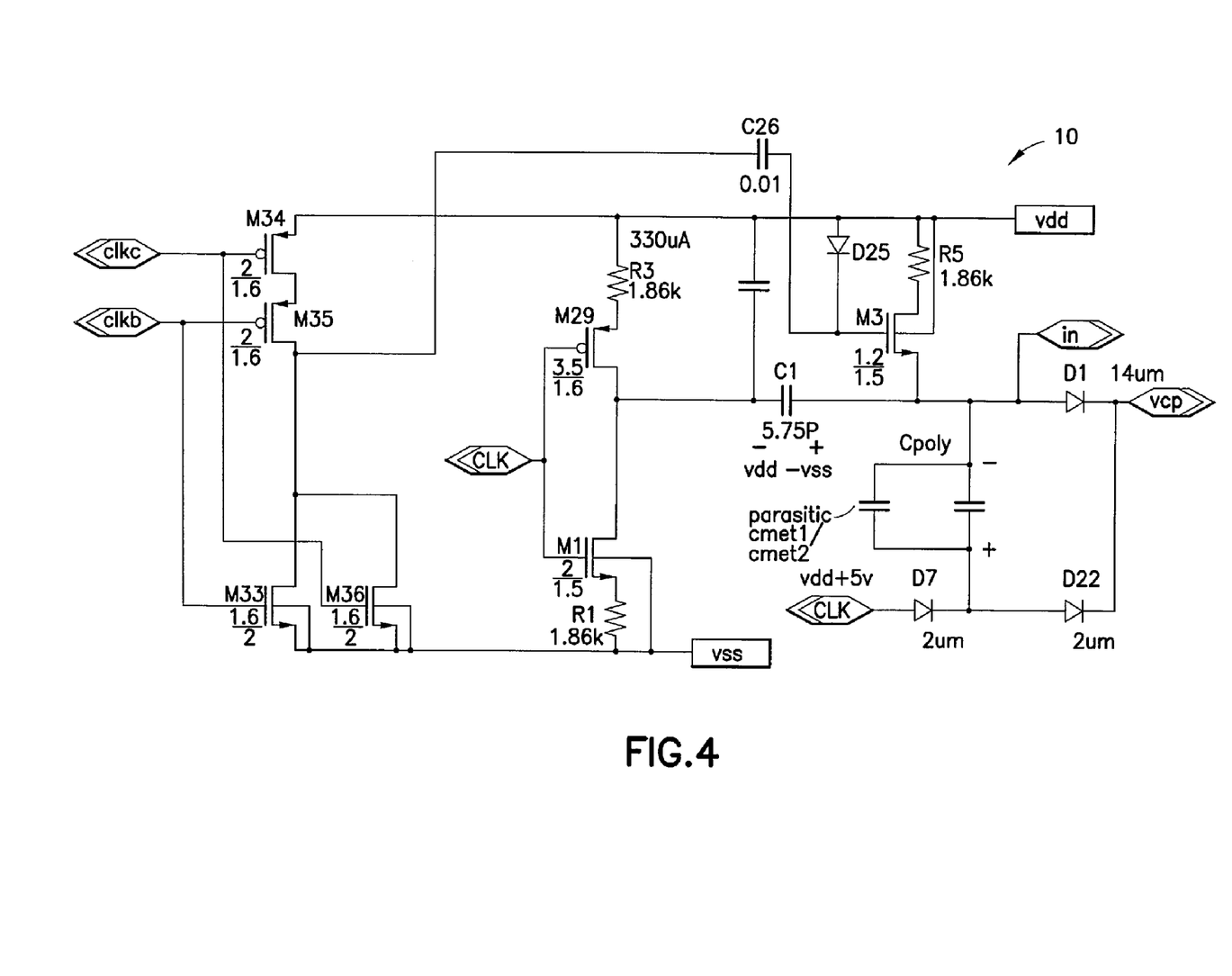
FIG. 4 shows a single two-stage charge pump of FIG. 2.

Each charge pump 10 works as follow, with reference to FIG. 4.

The charge pump 10 comprises transistors M34, M35, M33, M36, M1, M29 and M3. Further, it comprises a charging capacitor C1 and an additional second stage capacitor Cpoly. Further, Vcp is connected to either side of the capacitor Cpoly by diodes D1 and D22. OUT terminal is connected via diode D7 to one side of Cpoly and terminal IN is connected to the other side of Cpoly.

The circuit operates as follows. When main clock CLK, which is one of the clock signals from the ring oscillator is high, M1, an N-channel, device is turned on. Furthermore, M3 is also turned on. However, to avoid any shoot through via M3 that would discharge C1, a non-overlapping signal is applied to the gate of M3 by a combination of clock B and clock C generated by M34 and M35. Thus, M3 turns on after M1 turns on and turns off before M1 turns off. As a result, C1 is charged between Vdd and Vss to Vdd–Vss as shown in FIG. 4. When C1 is in the charging mode, Cpoly metal side is charged between IN and OUT, the latter being the IN terminal of another charge pump (phase). At this time, because of the out of phase clocking of the three clock signals, the other phase IN terminal is above Vdd at this time, i.e., by 5 volts, for example. M1 of the other charge pump is off, and M29 is on at this time. This is shown in FIG. 4 in that OUT is indicated as Vdd+5 volts at this time. Accordingly, Cpoly charges to 5 volts above Vdd. When transistor M1 is turned off and transistor M29 is turned on when the clock goes low, as M29 is a P-channel device, the DPplus side of C1 goes to Vdd. Thus, the IN terminal side of C1 now is 5 volts above Vdd. Since Cpoly is also charged to 5 volts above Vdd, the metal side of Cpoly is now at 5 volts+5 volts=10 volts. Cpoly then discharges through D22 to VCP providing an output voltage approaching 10 volts above Vdd at VCP.

As shown in FIG. 2, three stages are used, each 120° out of phase so that Cpoly will always charge to the desired voltage, here 5 volts, above Vdd to be added to the charge on C1.

Although three stages are shown in FIG. 2, the invention could be made using only two stages in which case only two clock signals would be required spaced at 180°. The circuit of FIG. 4 is different than the prior art circuit of FIG. 2, which also uses only two 180° out of phase clock signals, because the circuit of FIG. 2 does not employ a double stage such that the voltages on two capacitors are added to provide the increased charge pump voltage.

Figure 5:
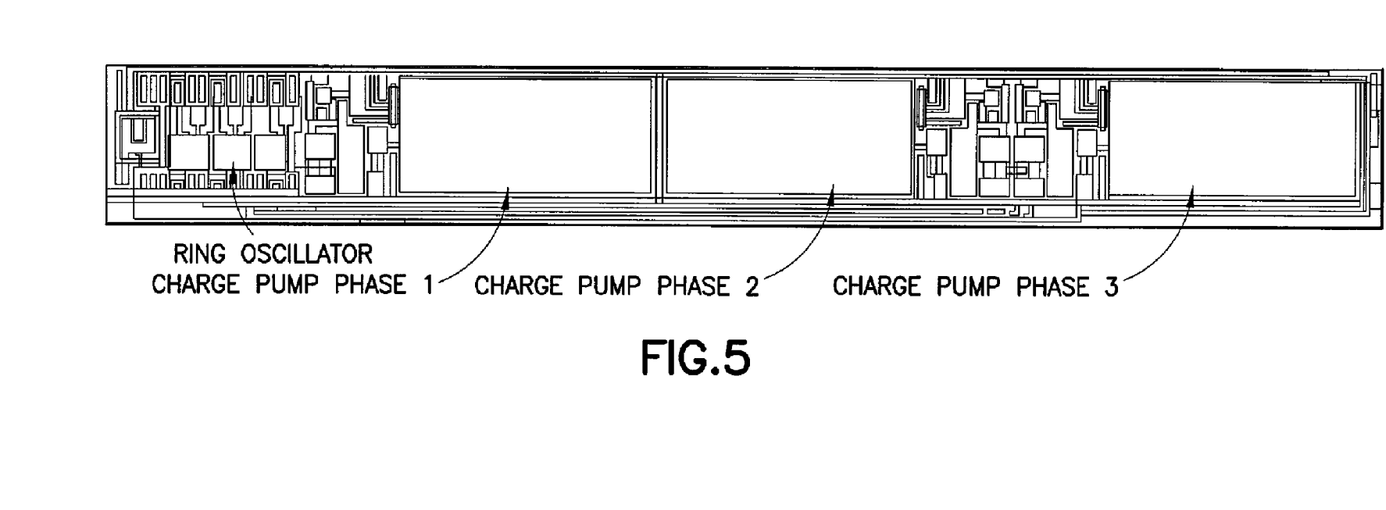
FIG. 5 shows a layout of the charge pump.

FIG. 5 shows an exemplary layout showing the location of the ring oscillator, charge pump 1, charge pump 2 and charge pump 3. In this layout, the capacitors are stacked metal 2, metal 1 and poly active p diffusion.

Figure 6:
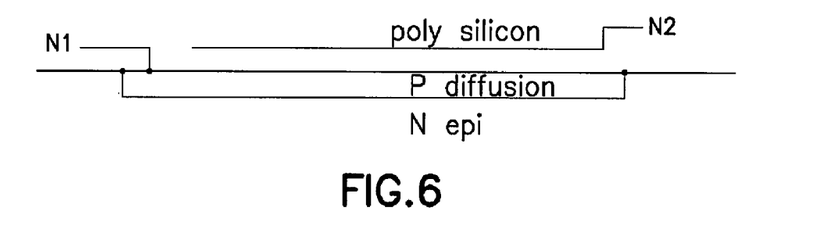
FIGS. 6-8 show how the capacitors in the charge pump are implemented.
Figure 7:
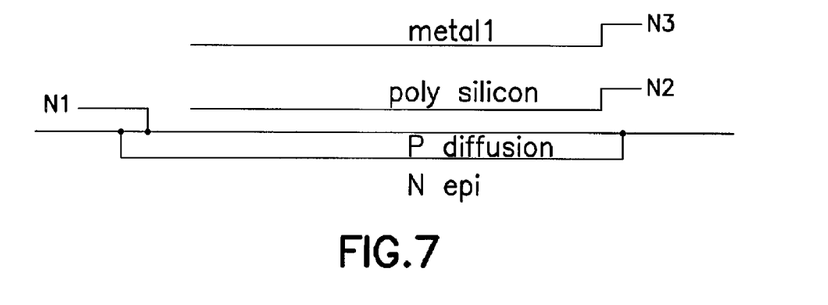
Figure 8:
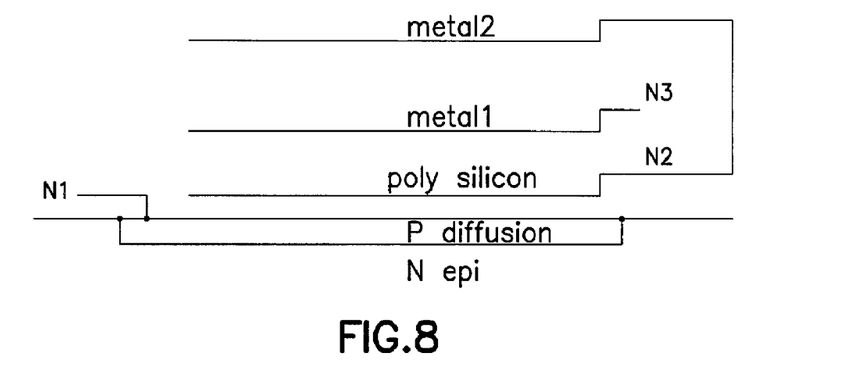

FIGS. 6, 7 and 8 show how the capacitors are formed.

FIG. 6 shows the first capacitor, i.e., the capacitor C1 used for the charge pump. The desired capacitor is, for example, 3 pF between POLY layer N2 and p-diffusion N1 via active so a very thin oxide (node N1 and N2) is employed. The parasitic p-diffusion to epitaxial layer is similar in value and will increase charge pump consumption.

FIG. 7 shows how the capacitors are stacked. The main capacitor C1 is the POLY to p-diffusion between N1 and N2. The metal N3 placed above the poly silicon layer creates a low value 0.2 pF thick field oxide capacitor which is used for the second stage pump capacitor Cpoly which is provided between N2 and N3. This capacitor does not increase the area since it is stacked.

Finally, FIG. 8 shows an improvement of the charge pump capacitance using a second metal, metal 2. Adding the metal 1 to metal 2 parasitic capacitance increases the capacitance between N2 and N3. The efficiency is improved for the same area. This is shown by the capacitor Cmet1/met2 across Cpoly in FIG. 4.

Figure 9:
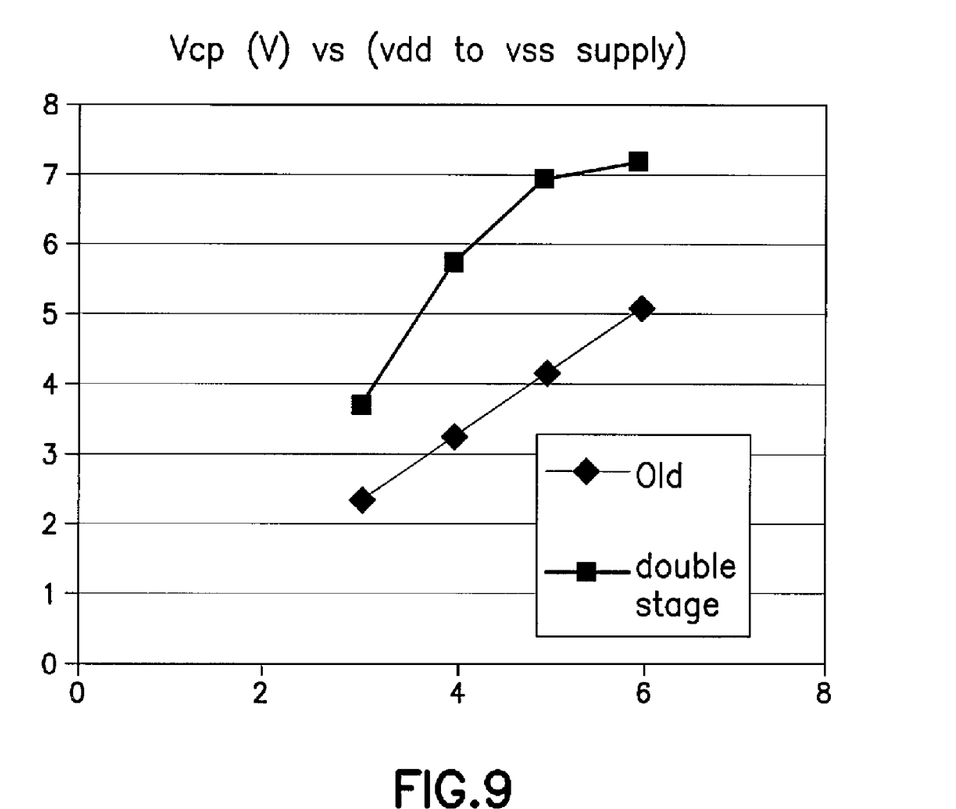
FIG. 9 shows the improvement provided by the charge pump circuit over the prior art circuit.

FIG. 9 shows the improvement provided by the charge pump according to the present invention over the prior art charge pump of FIG. 2. The new charge pump provides a much larger output voltage referenced to Vdd, here exceeding 7 volts. In this case, the supply can change from 4 volts to 6 volts and Vout is clamped at 6 volts. This means that Vcp of the double stage charge pump is 6 volts.

$V_{OUT}$ is used to turn on a logic level power MOSFET. The new charge pump allows turning the MOSFET in any case fully on. Previously, the power MOSFET was not fully on at low supply voltages increasing conduction losses.

The invention provides an improved charge pump to allow providing a higher charge pump voltage for gate driving. The invention uses a second stage capacitor which can be stacked above the first comparator and using parasitic capacitance to other layers to increase the capacitance without employing a larger surface area.

The invention preferably uses a three phase oscillator and generates a non-overlapping signal for each stage and preferably uses three charge pumps at 120° phasing to create a constant output current and to reduce electrical noise limiting the voltage ripple.

Although the present invention has been described in relation to particular embodiments thereof, many other variations and modifications and other uses will become apparent to those skilled in the art. Therefore the present invention should be limited not by the specific disclosure herein, but only by the appended claims.

What is claimed is:

1. A charge pump circuit comprising:
    a plurality of charge pumps each having their outputs connected in parallel, each charge pump receiving a plurality of clock signals,
    a clock signal oscillator for providing the plurality of clock signals, the clock signals being out of phase,
    each charge pump having an output (VCP) that is coupled to the output of the at least one other charge pump, further comprising a first capacitor in each charge pump, the first capacitor being charged by a switching circuit receiving said clock signals to charge the first capacitor to a voltage between a supply voltage and a reference potential, and further comprising
    a second capacitor coupled in series with the first capacitor, the second capacitor provided between a first terminal (IN) of the charge pump and a second terminal (OUT) of the charge pump, wherein the first terminal (IN) of the charge pump is connected to a second terminal (OUT) of another charge pump and the second terminal (OUT) of the charge pump is connected to the first terminal (IN) of another charge pump, and wherein when the first capacitor is charged by said switching circuit, the second capacitor is charged by its connection to another charge pump, the switching circuit connecting a first terminal of said first capacitor to the supply voltage thereby elevating a second terminal of said first capacitor to an elevated voltage, the second terminal of the first capacitor being connected to a first terminal of the second capacitor, and thereby elevating a second terminal of the second capacitor to a further elevated voltage elevated above the elevated voltage on the first capacitor, the further elevated voltage on the second terminal of the second capacitor being provided to the charge pump output.

2. The charge pump circuit of claim 1, wherein the switching circuit comprises a first switch that is turned on by a first clock signal and a second switch that is turned on by at least a second of said clock signals thereby to charge the first capacitor, and further comprising a third switch that operates complementary to said first switch to connect the first terminal of said first capacitor to the supply voltage.

3. The charge pump circuit of claim 2, wherein there are three charge pumps each receiving three clock signals that are 120° out of phase.

4. The charge pump circuit of claim 3, wherein the second terminal of said first capacitor is coupled by a diode to the charge pump output and the first terminal of the second capacitor is coupled to the second terminal of the first capacitor and the second terminal of the second capacitor is coupled by a further diode to said charge pump output.

5. The charge pump circuit of claim 4, wherein the second terminal (OUT) of the charge pump is connected via an additional diode to said second terminal of said second capacitor.

6. The charge pump circuit of claim 5, wherein the first terminal (IN) of the charge pump is connected to the second terminal of the first capacitor.

7. The charge pump circuit of claim 2, further comprising additional switches receiving further ones of said clock signals for preventing shoot through via the second switch that would discharge the first capacitor.

8. The charge pump circuit of claim 7, wherein said additional switches receive said further ones of said clock signals to generate a non-overlapping signal that turns the second switch on after the first switch turns on and off before the first switch turns off.

9. The charge pump circuit of claim 1, wherein the first capacitor is provided between a polysilicon layer and a p-diffusion in an epitaxial layer and wherein the second capacitor is stacked above the first capacitor and is provided by the polysilicon layer of the first capacitor and a metal layer disposed over the polysilicon layer.

10. The charge pump circuit of claim 9, further comprising a second metal layer above the first metal layer to increase the capacitance of the second capacitor.

11. The charge pump circuit of claim 1, wherein the clock signal oscillator comprises a ring oscillator.

12. The charge pump circuit of claim 3, wherein the three clock signals have a 50% duty cycle.

* * * * *